United States Patent
Malvar

(10) Patent No.: US 6,477,280 B1
(45) Date of Patent: Nov. 5, 2002

(54) LOSSLESS ADAPTIVE ENCODING OF FINITE ALPHABET DATA

(75) Inventor: Henrique S. Malvar, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/277,255

(22) Filed: Mar. 26, 1999

(51) Int. Cl.$^7$ .................................................. G06K 9/36
(52) U.S. Cl. ...................................... 382/245; 382/232
(58) Field of Search ................................ 341/50–51, 59, 341/65, 68–69, 90; 375/241, 253; 382/245

(56) References Cited

U.S. PATENT DOCUMENTS

| | | | |
|---|---|---|---|
| 4,626,829 A | * 12/1986 | Hauck | 340/347 |
| 5,381,145 A | 1/1995 | Allen et al. | 341/107 |
| 5,583,500 A | * 12/1996 | Allen et al. | 341/107 |
| 5,602,589 A | 2/1997 | Vishwanath et al. | 348/398 |
| 5,717,394 A | * 2/1998 | Schwartz et al. | 341/51 |
| 5,818,877 A | * 10/1998 | Tsai et al. | 375/241 |

FOREIGN PATENT DOCUMENTS

| | | | |
|---|---|---|---|
| EP | 0940994 | 2/1999 | H04N/7/26 |
| WO | 93/17524 | * 9/1993 | H04N/7/13 |
| WO | 98/19263 | 5/1998 | G06F/19/00 |
| WO | 98/54903 | * 12/1998 | H04N/7/26 |

OTHER PUBLICATIONS

Langdon, G. G.: An Adaptive Run–Length Coding Algorithm, IBM Technical Disclosure Bulletin, NB 83123783, 1983.

Bell, T.; Witten, I.H.; Cleary, J. G.: Modeling For Text Compression, ACM Computing Surveys, Dec. 1989, vol. 21, No. 4, pp. 557–591.

"International Search Report for International Application No. PCT/US/00/07955", Date of Completion Jul. 20, 2000—Authorized Office Fassnacht, C., 10 pages, (Jul. 31, 2000).

Chang, S.G., et al., "A simple block–based lossless image compression scheme", *Conf. record on thirtieth asilomar confers on signals, systems and computers*, Pacific Grove, CA, vol. 1, XP000925098, 591–595, (1997).

Howard, P.G., et al., "Fast progressive lossless image compression", *Proceeddings of the SPIE*, US SPIE, Bellingham, VA, Nol. 2186, XP000614258, 981–109, (Feb. 9, 1994).

(List continued on next page.)

Primary Examiner—Phuoc Tran
Assistant Examiner—Amir Alavi
(74) Attorney, Agent, or Firm—Lyon & Harr, LLP; Richard T. Lyon

(57) ABSTRACT

An encoder reorders quantized wavelet coefficients to cluster large and small wavelet coefficients into separate groups without requiring the use of data-dependent data structures. The coefficients are then adaptively encoded based on a run-length code which continuously modifies a parameter that controls the codewords uses to represent strings of quantized coefficients, seeking to minimize the number of bits spent in the codewords. A matrix of indices contains the coarsest coefficients in the upper left corner, and filling in low high and high low sub bands in larger and larger blocks in an alternating manner, such that low high sub bands comprise the top of the matrix and the high low sub bands comprise the left side of the matrix. The shortest codewords are assigned to represent a run of the most likely character having length of $2^k$, where k is a parameter. k is adjusted based on successive characters being encountered. k is increased when the character is the same, and decreased when the character is different. A decoder applies the above in reverse order. Decoding of the encoded coefficients is first performed, followed by an unshuffling of the coefficients. The unshuffled coefficients are then subjected to an inverse wavelet transform to recover the transformed and compressed data, such as image pixels.

39 Claims, 7 Drawing Sheets

OTHER PUBLICATIONS

Langdon, G.G., et al., "A Simple General Binery Source Code", *IEEE Transactions on Information Theory*, vol. 28, No. 5, Pt. 1, XP000915490, 800–803, (Sep. 1982).

Malvar, H.S., "Fast Progressive Wavelet Coding", *IEEE, Procedings of conference on data compression*, Snowbird, UT, XP002142847, 336–343, (1999).

Ordentlich, E., et al., "A low–complexity modeling approach for embedded coding of wavelet coefficients", *Proceedings DCC '98 Data Compression Conference* (Cat No. 98TB100225) Snowbird, UT, XP000925096, 408–417, (1998).

de Queriroz, R., et al., "Wavelet transforms in a jpeg–llike image coder", *IEEE transactions on circuits and systems for video technology*, IEEE Inc, New York, vol. 7, No. 2, XP000687660, 419–424, (Apr. 1997).*

Rossetti, F., et al., "Improved scanning methods for wavelet coefficients of video signals", *Signal Processing. Image Communication NL Elsevier Science Publishers*, vol. 8, No. 4, XP000586007, 365–378, (May 1, 1996).*

* cited by examiner

LOSSLESS ADAPTIVE ENCODING OF FINITE ALPHABET DATA

REFERENCE TO RELATED APPLICATIONS

This application is related to co-pending applications having Ser. No. 09/276,954 entitled Image Encoding Using Reordering and Blocking of Wavelet Coefficients Combined with Adaptive Encoding and Ser. No. 09/280,135 entitled Reordering Wavelet Coefficients For Improved Encoding and assigned to the same assignee as the present application and filed on the same day herewith and incorporated by reference.

FIELD OF THE INVENTION

This invention relates generally to the field of image compression and in particular to an improved wavelet encoding and decoding of digital pictures.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawing hereto: Copyright® 1998, Microsoft Corporation, All Rights Reserved.

BACKGROUND

Digital pictures are used in many applications, such as Web pages, CD-ROM encyclopedias, digital cameras, and others. In most cases is necessary to compress the pictures, in order for them to fit into a small amount of storage or to be downloaded in a short amount of time. For example, in a typical digital camera, pictures are taken at a resolution of 1024×768 picture elements (pixels), with a resolution of 12 to 24 bits per pixel. The raw data in each image is therefore around 1.2 to 2.5 megabytes. In order to fit several pictures in a computer diskette, for example, it is necessary to reduce the amount of data used by each picture. The larger the compression ration that is achieved, the more pictures will fit into a diskette or memory card and the. faster they can be transferred via bandwidth limited transmission medium such as telephone lines.

Image compression has been extensively studied over the past twenty years. The JPEG standard, defined by the JPEG (joint photographic experts group) committee of ISO (International Standards Organization), was defined in 1992 and is the most popular method of compressing digital pictures. In JPEG, small square blocks of pixels (of dimensions 8×8) are mapped into the frequency domain by means of a discrete cosine transform (DCT). The DCT coefficients are quantized (divided by a scale factor and rounded to the nearest integer) and mapped to a one-dimensional vector via a fixed zigzag scan pattern. That vector is encoded via a combination of run-length and Huffinan encoding.

The independent processing of small 8×8 blocks in JPEG is an advantage from an implementation viewpoint, especially in low-cost hardware. However, it also leads to the main problem with JPEG: blocking artifacts. Because the quantization errors from adjacent blocks are uncorrelated among blocks but correlated within the blocks, the boundaries of the 8×8 blocks becomes visible in the reconstructed image due to the potential difference in encoding between adjacent blocks. Such artifacts are referred to as tiling or blocking artifacts which can be reduced (but not completely eliminated) by using transforms with overlapping basis functions.

An efficient way to remove the blocking artifacts is to replace the block DCT by a wavelet decomposition, which provides an efficient time-frequency representation. Very good compression performance can be obtained by quantizing and encoding wavelet coefficients.

Many wavelet-based image compression systems have been reported in the technical literature in the past few years. With wavelets it is possible to achieve compression ratios that typically range from 20% to 50% better than JPEG. More importantly, wavelet transforms lead to pictures that do not have the disturbing blocking artifacts of JPEG. Therefore, wavelet-based transforms are becoming increasingly popular. In fact, in the next revision of JPEG, named JPEG2000, all proposals under consideration use wavelets.

Some prior wavelet transforms decompose images into coefficients corresponding to 16 subbands. This results in a four by four matrix of subbands, referred to as a big block format, representing spectral decomposition and ordering of channels. The letters L and H are used to identifying low pass filtering and high pass filtering respectively for each subband. The first subband comprises LL and HL coefficients, where the first letter in each set correspond to horizontal filtering and the second corresponds to vertical filtering. Two stages are used in each subband filtering combination. The ordering corresponds to frequencies increasing from left to right and from bottom to top. This ordering is fixed to allow both encoding and decoding to function in a fixed manner. Quantization of the coefficients is then performed, followed by some form of compressive encoding of the coefficients, including adaptive Huffinan encoding or arithmetic encoding to further compress the image. These forms of encoding can be quite complex, including zero tree structures, which depend on the data types. These encoders are fairly complex, and many need to be modified for different images to be compressed, making them difficult to implement in hardware.

There is a need for a simple encoding technique that works on wavelet compression coefficients and similar finite alphabet data which may be implemented in either hardware or software.

SUMMARY OF THE INVENTION

Adaptive encoding is performed on signed integer data for which values of smaller magnitude are more likely to occur than those with higher magnitudes. The encoding is performed in bit planes, which allows for scalability in precision of reconstruction, from lossless (no errors) to various levels of approximated reconstruction. Unlike Huffinan encoding, code tables are not necessary because simple rules determine the code words from the input strings.

In one form, for each bit plane, the shortest code word (a single 0) is assigned to represent a run of the most likely input, zero, having length $2^k$, where k is a parameter that controls the codewords used to represent strings of quantized coefficients, seeking to minimize the number of bits spent in the codewords. K is adapted to increase when longer runs are encountered, and to decrease otherwise, e.g., when symbols different from those in the run are encountered. The encoding of the bit planes can be done with any efficient entropy encoder, such as an adaptive arithmetic encoder, but in one implementation, a new adaptive Run-length plus Golomb-Rice encoder is used.

By not requiring the use of data-dependent data structures such as zerotrees, or a separate list for set partitions in trees, hardware implementations are easier to build and software implementations may run faster.

DETAILED DESCRIPTION

In the following detailed description of exemplary embodiments of the invention, reference is made to the accompanying drawings, which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

The detailed description is divided into multiple sections. A first section describes the operation of a computer system that implements the current invention. This is followed by a high level description of a fixed reordering of quantized wavelet coefficients and adaptive run-length encoding of them. A decoder for such encoded data is also described. Further detail of selected blocks of the high level description is then described by use of flowcharts. This is followed by a general description of the use of such encoders and decoders in an office suite of software applications. A conclusion describes some potential benefits and describes further alternative embodiments.

Hardware and Operating Environment

Figure 1:
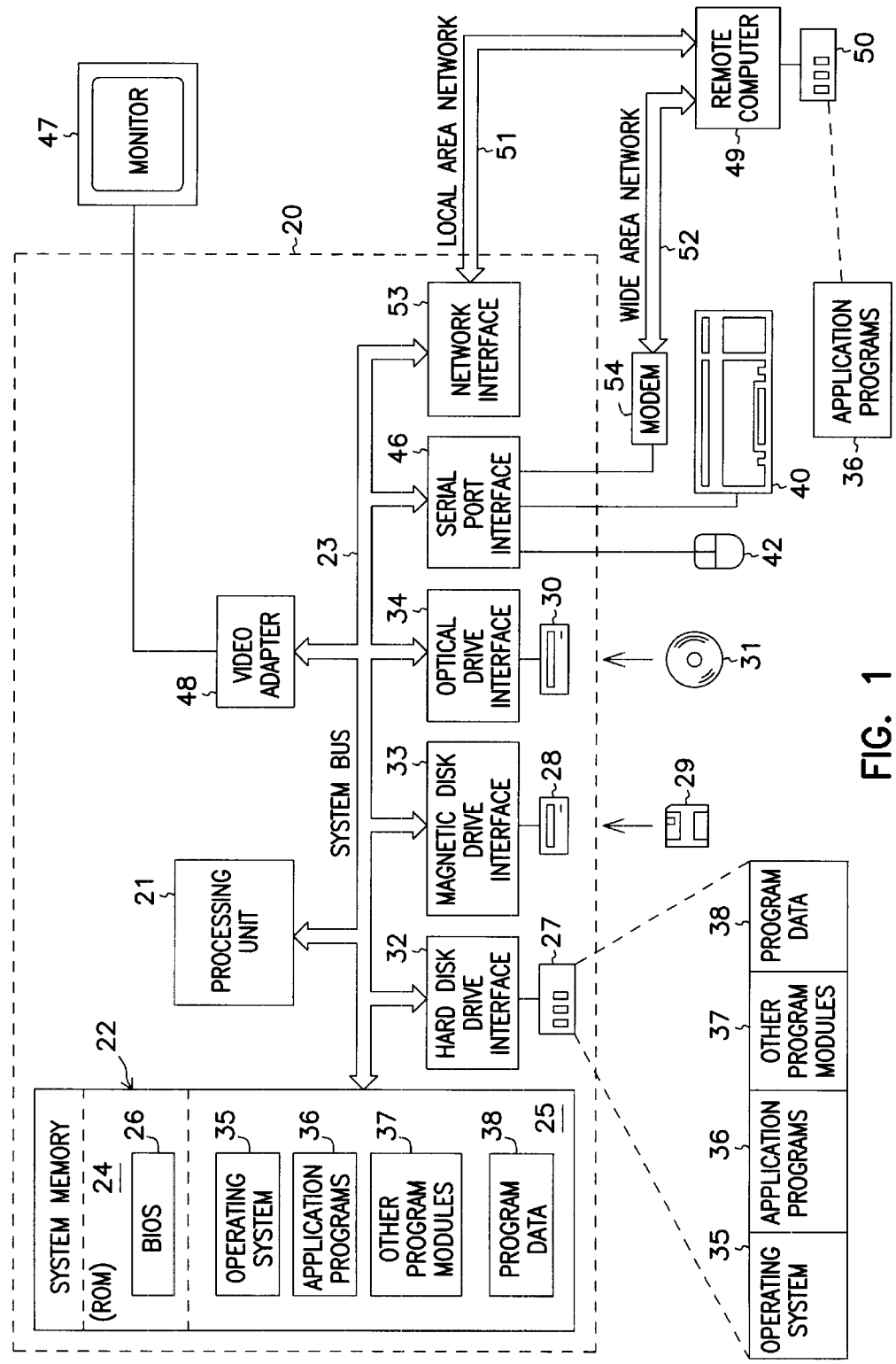
FIG. 1 is a block diagram of a computer system on which the present invention may be implemented.

FIG. 1 provides a brief, general description of a suitable computing environment in which the invention may be implemented. The invention will hereinafter be described in the general context of computer-executable program modules containing instructions executed by a personal computer (PC). Program modules include routines, programs, objects, components, data structures, etc. that perform particular tasks or implement particular abstract data types. Those skilled in the art will appreciate that the invention may be practiced with other computer-system configurations, including hand-held devices, multiprocessor systems, microprocessor-based programmable consumer electronics, network PCs, minicomputers, mainframe computers, and the like which have multimedia capabilities. The invention may also be practiced in distributed computing environments where tasks are performed by remote processing devices linked through a communications network. In a distributed computing environment, program modules may be located in both local and remote memory storage devices.

FIG. 1 shows a general-purpose computing device in the form of a conventional personal computer 20, which includes processing unit 21, system memory 22, and system bus 23 that couples the system memory and other system components to processing unit 21. System bus 23 may be any of several types, including a memory bus or memory controller, a peripheral bus, and a local bus, and may use any of a variety of bus structures. System memory 22 includes read-only memory (ROM) 24 and random-access memory (RAM) 25. A basic input/output system (BIOS) 26, stored in ROM 24, contains the basic routines that transfer information between components of personal computer 20. BIOS 26 also contains start-up routines for the system. Personal computer 20 further includes hard disk drive 27 for reading from and writing to a hard disk (not shown), magnetic disk drive 28 for reading from and writing to a removable magnetic disk 29, and optical disk drive 30 for reading from and writing to a removable optical disk 31 such as a CD-ROM or other optical medium. Hard disk drive 27, magnetic disk drive 28, and optical disk drive 30 are connected to system bus 23 by a hard-disk drive interface 32, a magnetic-disk drive interface 33, and an optical-drive interface 34, respectively. The drives and their associated computer-readable media provide nonvolatile storage of computer-readable instructions, data structures, program modules and other data for personal computer 20. Although the exemplary environment described herein employs a hard disk, a removable magnetic disk 29 and a removable optical disk 31, those skilled in the art will appreciate that other types of computer-readable media which can store data accessible by a computer may also be used in the exemplary operating environment. Such media may include magnetic cassettes, flash-memory cards, digital versatile disks, Bernoulli cartridges, RAMs, ROMs, and the like.

Program modules may be stored on the hard disk, magnetic disk 29, optical disk 31, ROM 24 and RAM 25. Program modules may include operating system 35, one or more application programs 36, other program modules 37, and program data 38. A user may enter commands and information into personal computer 20 through input devices such as a keyboard 40 and a pointing device 42. Other input devices (not shown) may include a microphone, joystick, game pad, satellite dish, scanner, or the like. These and other input devices are often connected to the processing unit 21 through a serial-port interface 46 coupled to system bus 23; but they may be connected through other interfaces not shown in FIG. 1, such as a parallel port, a game port, or a universal serial bus (USB). A monitor 47 or other display device also connects to system bus 23 via an interface such as a video adapter 48. In addition to the monitor, personal computers typically include other peripheral output devices (not shown) such as speakers and printers.

Personal computer 20 may operate in a networked environment using logical connections to one or more remote computers such as remote computer 49. Remote computer 49 may be another personal computer, a server, a router, a network PC, a peer device, or other common network node. It typically includes many or all of the components described above in connection with personal computer 20; however, only a storage device 50 is illustrated in FIG. 1. The logical connections depicted in FIG. 1 include local-area network (LAN) 51 and a wide-area network (WAN) 52. Such networking environments are commonplace in offices, enterprise-wide computer networks, intranets and the Internet.

When placed in a LAN networking environment, PC 20 connects to local network 51 through a network interface or adapter 53. When used in a WAN networking environment such as the Internet, PC 20 typically includes modem 54 or other means for establishing communications over network 52. Modem 54 may be internal or external to PC 20, and connects to system bus 23 via serial-port interface 46. In a networked environment, program modules, such as those comprising Microsoft® Word which are depicted as residing within 20 or portions thereof may be stored in remote storage device 50. Of course, the network connections shown are illustrative, and other means of establishing a communications link between the computers may be substituted.

Software may be designed using many different methods, including object oriented programming methods. C++ and Java are two examples of common object oriented computer programming languages that provide functionality associated with object oriented programming. Object oriented programming methods provide a means to encapsulate data members (variables) and member functions (methods) that operate on that data into a single entity called a class. Object oriented programming methods also provide a means to create new classes based on existing classes.

An object is an instance of a class. The data members of an object are attributes that are stored inside the computer memory, and the methods are executable computer code that act upon this data, along with potentially providing other services. The notion of an object is exploited in the present IS invention in that certain aspects of the invention are implemented as objects in one embodiment.

An interface is a group of related functions that are organized into a named unit. Each interface may be uniquely identified by some identifier. Interfaces have no instantiation, that is, an interface is a definition only without the executable code needed to implement the methods which are specified by the interface. An object may support an interface by providing executable code for the methods specified by the interface. The executable code supplied by the object must comply with the definitions specified by the interface. The object may also provide additional methods. Those skilled in the art will recognize that interfaces are not limited to use in or by an object oriented programming environment.

High Level Encoder and Decoder Description

Figure 2:
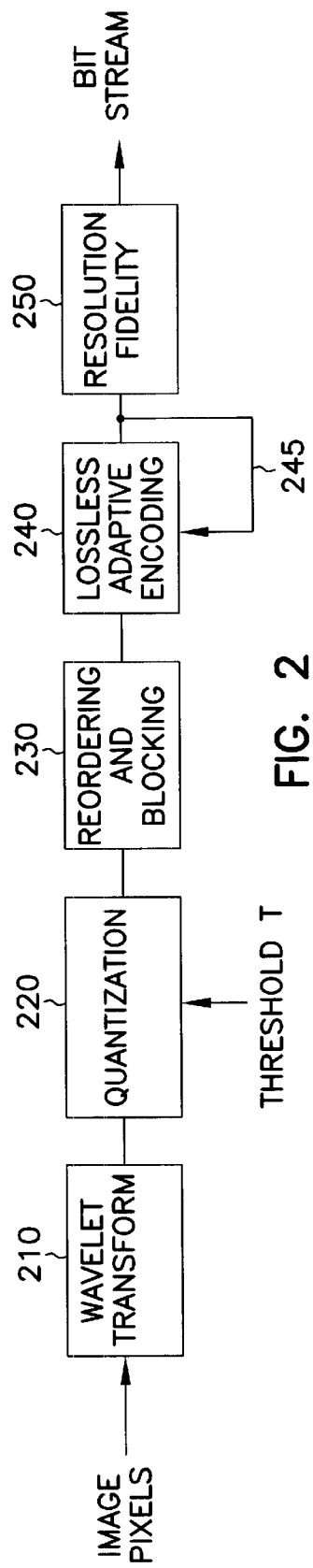
FIG. 2 is a block diagram of an encoder that reorders wavelet coefficients and encodes then in a lossless adaptive manner.
Figure 3:
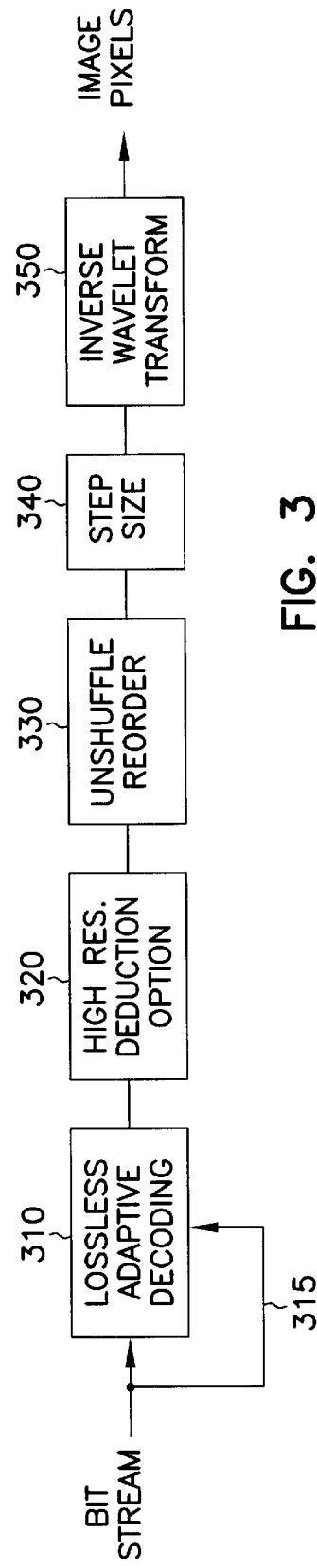
FIG. 3 is a block diagram of a decoder that decodes and unshuffles the encoded coefficients produced by the encoder of FIG. 2.

A simplified block diagram of a wavelet transform based image pixel encoder is shown in FIG. 2, with a corresponding decoder shown in FIG. 3. While the encoder and decoder are described with respect to image pixel data as the respective input and output, other data can also be transformed as desired. In the embodiment shown, image pixel data is provided to a wavelet transform block 210, which operates in a known manner to provide wavelet coefficients to a quantization block 220. The wavelet coefficients are in a big block format as described in the background section. Quantization is performed by means of a uniform quantizer, which is controlled by a quantization step defining threshold T. This results in the representation of each coefficient falling between the steps by the value in the middle of the step. The smaller T, the less loss is incurred in the quantization. Thus, the output of block 220 is a series of integer numbers, which are quantized wavelet coefficients. As in many other applications, the quantizer may be based on normal rounding, or in rounding towards zero (also known as a quantizer with a "dead zone").

Figure 4:
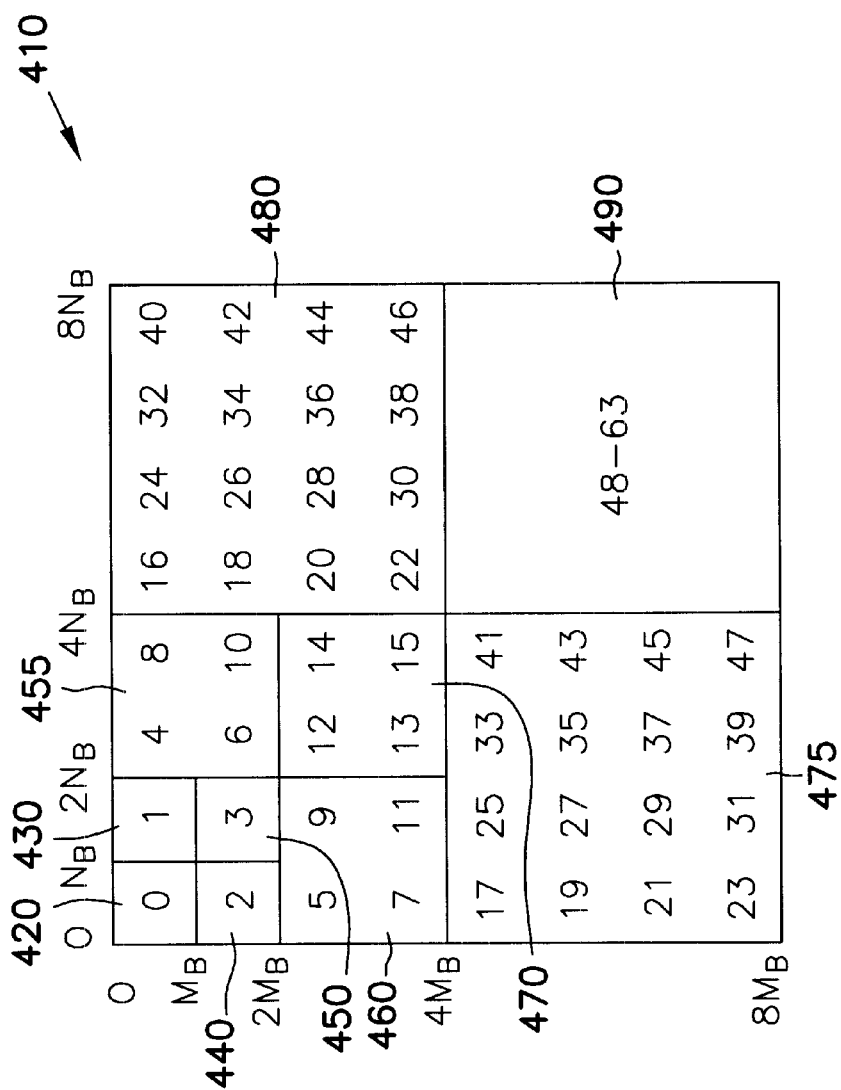
FIG. 4 is a block diagram of the reordered wavelet coefficients produced by the encoder of FIG. 2.

A reordering and blocking function or block 230 groups wavelet coefficients into clusters of like values. It results in a clustering or grouping together of the blocks of frequency coefficients which are most likely to be zero. The reordering increases the likelihood of groupings of similar data, in the sense that the data tends to have a monotonically decaying distribution of amplitudes. The first blocks tend to have data of larger amplitude, whereas in subsequent blocks the amplitudes of the wavelet coefficients tend to decay. The grouping is done by fixing a scanning order, which is data independent. One set of such grouping is shown in FIG. 4, for an example with 64 blocks of wavelet coefficients. In FIG. 4, low frequency components are placed toward the upper left corner of the grouping with an alternation of blocks of coefficients from low-high and high-low subbands at each level. Reordering and blocking block 230 provides a sequence of macroblocks in the scanning order indicated. The first block, 0, contains all coefficients of level 0 of the wavelet tree. This corresponds to the coarsest resolution. Blocks 0 to 3 comprise all the coefficients of level 1. Blocks 0 to 15 comprise all coefficients of level 2, while level 3 comprises blocks 0 to 63. Note that the blocks alternate from low-high and high-low subbands at each level, with low-high being the top of the sequence. In the Mathematical Description section below we will discuss the advantages of that particular ordering. Other orderings are possible as will be seen by one skilled in the art, but the above ordering appears to work better than others. The bits are when encoded sequentially, starting at the most significant bit.

An adaptive encoding block 240 receives the macroblocks and encodes them in a lossless manner. The clustering of the blocks provide data to compress which has large clusters of zeros. Further reordering the data by encoding on a bit plane basis increases the likelihood of finding large strings of zeros. Starting with the most significant bit for the first bit plane leads to a higher likelihood of a long string of zeros. Further, this also ensures that the most relevant data is encoded first. By the time the third or fourth bit planes are encoded, the odds are about equal for a zero as opposed to a one, and straight binary encoding may be effectively used.

The encoder is an adaptation of a Golomb-Rice encoder with adaptive run-length modifications. In simple terms, a string of $2^k$ zeros is represented by the codeword consisting of a single bit equal to zero. The length of the string of zeros represented by the zero codeword is controlled by the parameter k, which is varied as data is encountered, based on the observed frequency of zeros. When a zero value is encoded, it is assumed that zeros are more likely, and so the value of the parameter k is increased. When a nonzero value is encountered, k is decreased. By controlling the amount of such increase and decrease appropriately, the encoder can track well a string of bits with a varying probability of zero, without the need of the overhead of actually estimating that probability. A feedback loop 245 is used to represent the backwards adaptive nature of the encoder 240. This encoding provides for efficient compression and fast adaptation to changes in the statistics of the incoming data. Encoder 240 provides a bit stream out which is effectively progressive in that the most relevant information is provided at the beginning of the bit stream. Since the least significant bits are encoded in the last bit plane, for lower resolution bit streams, they may effectively be discarded or not encoded, as represented at a resolution fidelity block 250. This is useful for lower bandwidth transmissions of data.

Decoding, as shown in block form in FIG. 3 is essentially the reverse of the encoding and data transformations. A bit stream of encoded data, such as that produced by the encoder of FIG. 2 is received at a lossless adaptive decoding block 310. The bit stream may be received directly from the decoder, from local storage, or from a remote decoder or storage via one of many viable transmission media such as by satellite transmission, cable transmission or other network. Decoding block 310 receives the rules developed during encoding via a feed forward line 315. Block 310 essentially receives the string length to be used, and reconstructs the data in accordance with the rules. Again, it operates on a block level, but this is not a requirement of the invention. It simply makes it more convenient than working with an entire representation of an image or other data all at the same time, which would require a larger amount of memory, or paging if such memory was not available. One form of fidelity reduction may be performed at block 310 just by not decoding the last bit in the bit plane. This effectively doubles the step size controlled by the parameter T. It is a simple way to reduce the fidelity of the data.

The data out of block 310 should be identical to the integer data coming out of block 230. However, higher resolution layers of the image at 320 may be removed at this point as indicated at block 320, just by effectively not using the higher frequency wavelet coefficients. This would be useful if the window used to display an image or set of images is small. Block 330 then is used to unshuffle or reorder the blocks back to the original positions. The output of the reorder block 330 is the integer numbers that need to be remultiplied back at block 340 by using the step size which is provided by a header in the received bit stream. This provides reconstructed wavelet coefficients. The header also provides information about how big the image size is, and other standard image format data. An inverse wavelet transform is then performed in a known manner at 350. It should be noted that the only losses, other than selected desired fidelity or resolution reductions, are incurred in the quantization steps, which is controllable by modification of the T parameter.

The resolution reduction option block 320 may operate in a few different ways. One way to remove the data is by zeroing the integers involved. A further way to reduce the resolution is to modify the operation of unshuffle block 330, which may be instructed to zero the values at a desired point. By telling both unshuffle block 330, and inverse wavelet transform block 350 where the zeros start, they may be easily modified to eliminate unneeded processing of actual data at such points.

The adaptive encoding and decoding of the present invention operates very well on data that has clustered zeros with statistics that change. This type of data may also be characterized as having a high probability of data with near exponential decay of the probability on either side of the zeros. Multimedia data, such as static image data and video has this characteristic. Further, the transformation of many types of physical data also has this type of characteristic. When capturing physical data, the information normally occurs in just a few places, which means that most of the other data is zero. Symmetry of the data is also a desired characteristic for this type of encoding to work best. In other words, an exponential fall off of both negative and positive values on either side of an information spike is beneficial. Examples of such physical data include ECGs and other biometric type of data.

Mathematical Description of Encoding

A mathematical description of the transformations and encoding and decoding discussed above with respect to FIGS. 2 and 3 is now provided. The following steps define the encoding algorithm:

1. Given an image array $x(m, n)$, $m=0, 1, \ldots, M-1$, $n=0, 1, \ldots, N-1$, compute its wavelet transform coefficients $X(r, s)$, $r=0, 1, \ldots, M-1$, $s=0, 1, \ldots, N-1$.

2. Each coefficient $X(r, s)$ is quantized according to $$q(r,s) = \operatorname{sgn}(X(r,s)) \lfloor |X(r,s)|/T \rfloor \qquad (1)$$

where $\operatorname{sgn}(\cdot)$ is the usual signum function and T is a quantization threshold. This step maps the continuous wavelet coefficients $X(r, s)$ into a sequence of integers $q(r, s)$. This is the only step that introduces information loss.

3. The quantized coefficients are reordered and grouped into blocks according to $$u_k(l) = q(r_k + \operatorname{mod}(l, M_B), s_k + \lfloor l/M_B \rfloor) \qquad (2)$$

for $l=0, 1, \ldots, L-1$ and $k=0, 1, \ldots, K-1$, where $L=M_B N_B$ is the block size, $K=MN/L$ is the total number of blocks, and $M_B$ and $N_B$ are defined by $M_B=M/2^J$ and $N_B=N/2^J$. The parameter J controls the size of the rectangular blocks of quantized coefficients that are grouped in $u_k(l)$, and hence the block size.

For each k, the top left corner indices $(r_k, s_k)$ are defined according to the scan order previously described.

4. The blocks are grouped into macroblocks $U_i$ of fixed size $LK_B$, in the form $U_i = \{u_k(l)\}$, with $k=iK_B$, $iK_B+1, \ldots, iK_B+K_B-1$. For each macroblock, its bit planes are successively quantized according to the adaptive Run-length/Rice (RLR) coder. The binary encoding of the number of bits used by the RLR code for $U_i$ followed by the actual RLR output bits is appended to the output bitstream.

The following steps are then used to decode the PWC bitstream:

1. Decode the RLR-coded bits in macroblocks $U_i$, for $i=0, 1, \ldots, I_{max}-1$. If $I_{max} < K$, a lower resolution version of the wavelet coefficients is recovered. Note that within each macroblock just the first few bit planes are decoded, given the desired reconstruction accuracy. All bits in the bit planes of $q(r, s)$ that are chosen not to decode are set to zero. Resolution scalability is achieved by choosing $I_{max} < K$, whereas fidelity scalability is achieved by decoding only a subset of the bit planes for each macroblock.

2. After recovering the $q(r, s)$, the wavelet coefficients are reconstructed by $$\hat{X}(r,s) = \begin{cases} 0, & q(r,s) = 0 \\ T[q(r,s) + 1/2], & q(r,s) > 0 \\ T[q(r,s) - 1/2], & q(r,s) < 0 \end{cases} \quad (3)$$

It should be noted that the quantization rule in (2) combined with the reconstruction rule in (3) comprise a uniform quantizer with a dead zone around the origin, which is close to being optimal for minimal-entropy scalar quantization of random variables with Laplacian (double-sided exponential) probability distributions.

To reorder the wavelet coefficients, as described in Step 3 of the PWC encoder, the sequence of top left corner indices $(r_k, s_k)$ is defined. The scanning order depicted in FIG. 4, where $M_B = M/2^J$ and $N_B = N/2^J$ control the size of each block is used. The parameter J should be chosen such that block zero contains precisely all wavelet coefficients at the coarsest resolution, e.g. all scaling function coefficients. Therefore, J should be equal to the number of resolution levels (the tree depth) used in the wavelet transform. It is easy to infer from FIG. 4 the sequence of all top left corner indices $(r_k, s_k)$.

It is clear from FIG. 4 that in order to decode a complete set of coefficients at any desired level resolution, it is desirable to use all blocks from index 0 up to $K_{max}-1$, where $K_{max}$ is a power of four. Therefore, in Step 1 of the PWC decoder, $I_{max}-1$ is chosen such that $K_{max}$ is a power of four.

The reason for the alternate scanning of the low-high (LH) and high-low (HL) wavelet coefficients within the same resolution level is simple. Assuming the original image has a particular feature (or no feature) at some spatial location, it is likely that clusters of both the LH and HL subbands, corresponding to that location, will have large (or small) values. Therefore, by ensuring that pairs of blocks from the LH and HL subbands corresponding to the same spatial location appear contiguously in a macroblock or at least proximate or close to each other, we're more likely to create clusters of large and small values. That increases the probability of long runs of zeros in the bit planes of the quantized coefficients.

Figure 7:
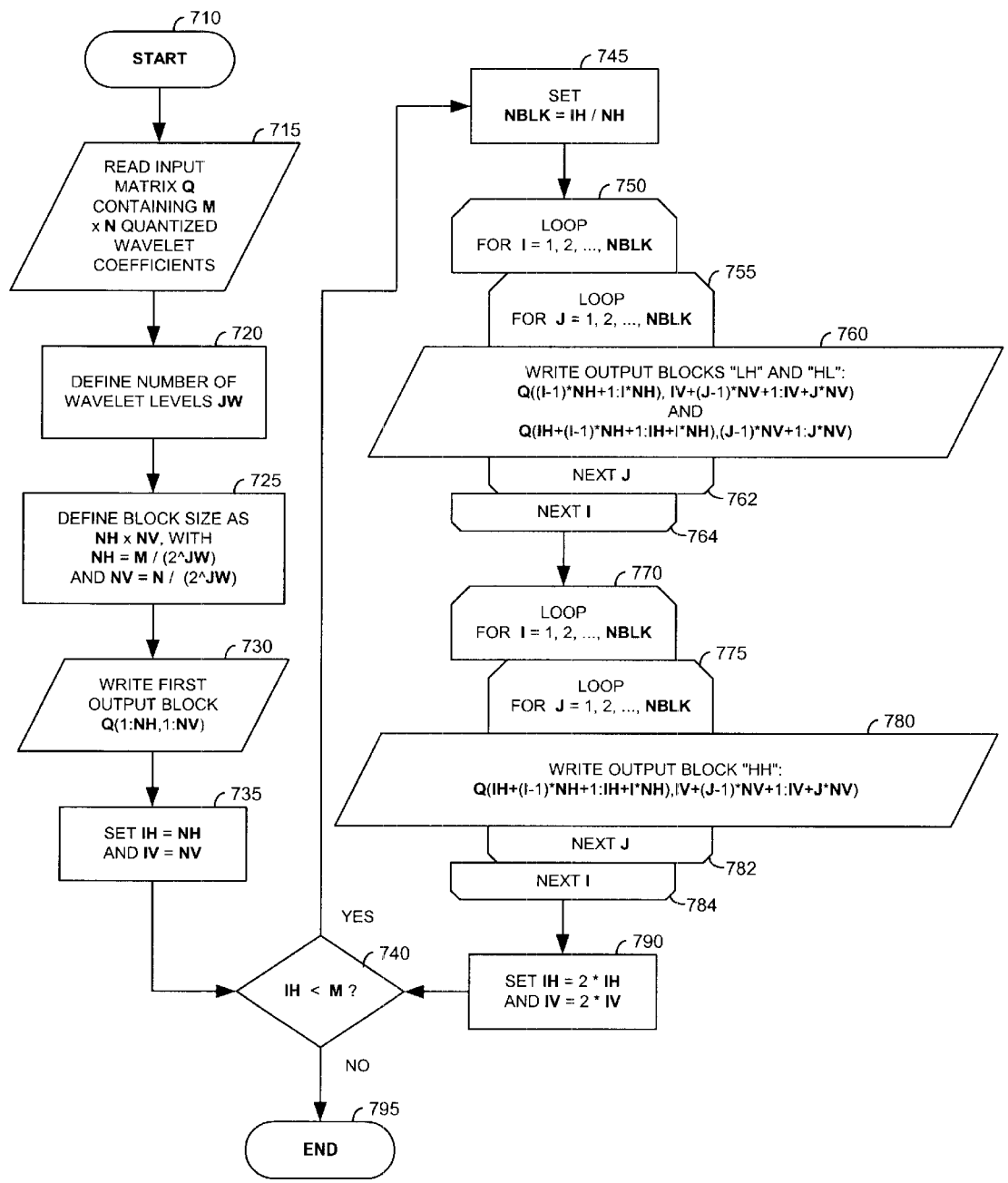
FIG. 7 is a flow chart showing the writing of a matrix of coefficients in a reordered manner consistent with that shown in FIG. 4.

A flowchart in FIG. 7 describes an algorithm used to write the blocks of coefficients in the order shown in FIG. 4. The algorithm may be implemented in computer program instructions, or in hardware, firmware or a combination of all as desired. The algorithm is entered at start block 710. An input matrix Q containing M×N quantized wavelet coefficients is read at 715. The coefficients are such as those provided by quantization block 220. A number of wavelet levels is defined at 720 in a known manner as JW. At block 725, a block size is defined as NH×NV, with NH equal to $M/(2^{JW})$ and NV equal to $N/(2^{JW})$. The first output block is then written at 730, and IH and IV are initialized as NH and NV respectively for use in defining loops for writing of further blocks, which are larger in size. For a simplified example, assume that in FIG. 4, the matrix Q is 16 by 16, with 4 levels, and a block size of 1. This provides an initial IH and IV of 1. In further examples, the block size is larger, such as 8×8 or 16×16, or even higher.

A decision block 740 is used to determine if the entire matrix of coefficients has been written by checking to see if IH is less than M. If IH is still less than M, more coefficients need to be written. As seen in FIG. 4, the first blocks of coefficients are of dimension 1 by 1, and then they increase to 2 by 2 and 4 by 4 etc. The next sets of flowchart blocks are used to write the succeeding blocks by looping from one to a block size parameter NBLK which is set at block 745 as IH/NH. A nested loop defined at 750 using I and 755 using J is used to control the order of writing of the output blocks LH and HL at 760. J is incremented at NEXT statement 762, while I is incremented at NEXT statement 764. his results in rows of the blocks being written first in this particular implementation. Columns may also be written first if desired, or any other order of writing may be used. For the first time through the loop, given a matrix of size 16 by 16 and 4 levels, $N_B$LK is also 1, so only blocks 430 and 440 are written.

Following the writing of the next LH and HL blocks, a second set of nested loops is set up at 770 and 775, again using I and J to define positions in which to write an output block at 780. This output block corresponds to HH blocks at the same level, which is block 450 for the first time through. NEXT J and NEXT I statements complete the nested loop at 782 and 784 respectively. It should be noted that the HH block could also have been written at the same time as the LH and HL blocks above since the nested loops are identical. After all the blocks at this level have been written, IH and IV are incremented as exponents of 2 at 790, and then compared at 740 to see if IH is still less than M. If IH is not less than M, the algorithm is exited at 795, after having provided at complete reordered set of wavelet coefficients in accordance with the present invention.

The second time through the nested loops, blocks 455, 460 and 470 are written, followed by blocks 480, 475 and 490 the third time through the nested loops. Larger matrix sizes with higher levels are also contemplated.

To recover the original order for decoding purposes, one can simply read the output of the reordering algorithm in the same manner in which it was written. All that is required is knowledge of the size of the original matrix, and the number of levels that were written. Then the writing order is simply reversed to provide the coefficients in the original order. A direct mapping may also be used, but would require significant additional bandwidth to provide.

Details of Bit-Plane Encoding

The process performed by encoding block 240 can be easily understood with the help of the diagram in Table 1. The bit planes are just the sequences of bits of a particular index in the binary representation (magnitude+sign) of the incoming quantized wavelet coefficients or other data. For example Table 1 shows the bit planes for the sequence of values {9, −6, 1, 0, −2, 3, −4, −1, 2}. In the table, bit plane 4 is the sequence {100000000}, bit plane 3 is the sequence {010000100}, bit plane 2 is the sequence {010011001}, and bit plane 1 is the sequence {101001010}.

TABLE 1

Bit plane decomposition of integer data

| DATA VALUES → | 9 | −6 | 1 | 0 | −2 | 3 | −4 | −1 | 2 |
|---|---|---|---|---|---|---|---|---|---|
| SIGN BIT → | 0 | 1 | 0 | 0 | 1 | 0 | 1 | 1 | 0 |
| BIT PLANE 4 → | 1 | 0 | 0 | 0 | 0 | 0 | 0 | 0 | 0 |
| BIT PLANE 3 → | 0 | 1 | 0 | 0 | 0 | 0 | 1 | 0 | 0 |
| BIT PLANE 2 → | 0 | 1 | 0 | 0 | 1 | 1 | 0 | 0 | 1 |
| BIT PLANE 1 → | 1 | 0 | 1 | 0 | 0 | 1 | 0 | 1 | 0 |

In the input data in Table 1, values of smaller magnitude seem to be more likely to occur, which is also typical of quantized wavelet data and finite alphabet data. One can see from the patterns above that the higher bit planes tend to show a higher frequency of zeros, because input values of higher magnitude are less likely. Bit plane 1 (the least significant bit) and the sign bit plane typically have zeros and ones with approximately equal frequency.

Figure 5:
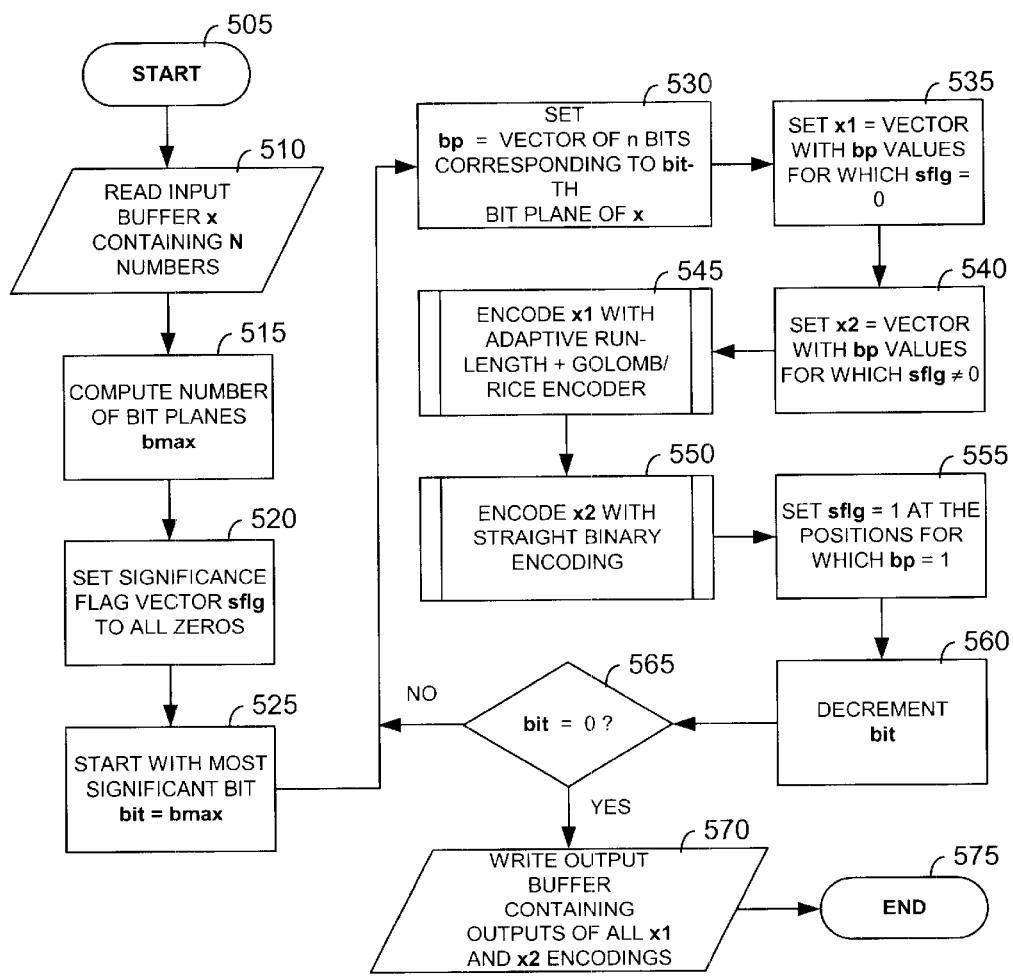
FIG. 5 is a flow chart showing high level operation of the coefficient encoder of FIG. 2, separating the coefficients into bit planes.

The flow chart in FIG. 5 describes the algorithm for efficiently encoding the incoming data through bit planes starting at 505. The bit planes are first read from an input buffer x at 510 which contains N numbers. The number of bits planes, bmax, is computed at 515, and a significance flag vector sflg is set to all zeros at 520.

At 525, the bit plane index variable bit is set equal to bmax, so encoding starts with the most significant bit plane. The values of the bits pointed to by the index "bit" form the bit plane vector bp at 530. For each plane bp, the bits are divided into two subsets as indicated at blocks 535 and 540. x1 correspond to positions for which a "1" entry has not been seen in the higher planes—those are called significant bits. x2 corresponds to positions for which a "1" has already been seen in the higher planes—those are called refinement bits.

At block 545, x1 is encoded with the adaptive run-length Golomb-Rice (ARLGR) encoder which will benefit from the higher frequency of zeros in x1. For every bit equal to 1 in x1, the sign bit is also encoded and appended at the end of the output code.

At block 550, x2 is encoded with straight binary encoding. This is done by appending the x2 bits to the output stream. Minimal loss in encoding efficiency is encountered because zeros and ones are usually equally likely in x2.

Note that the sign bits are not referred to as a bit plane because they are not processed as a bit plane. The sign bits are sent in the process of coding the x1 vectors of each bit plane. Thus, we can also think of the vector x1 as being drawn from the alphabet $\{0, +1, -1\}$, i.e. bit plus sign.

An important property of the flow chart in FIG. 5 is that the information on which are the bits that belong to x1 and which are the bits that belong to x2 does not need to be explicitly encoded. The vector sflg controls the allocation of bits to x1, and sflg is first initialized to all zeros, and then updated after each bit plane is encoded at 555. Therefore, the decoder can easily track the changes to sflg. To continue to the next bit plane, bit is decremented at 560 and checked to see if the last plane has been decoded at 565. If not, control goes to block 530 for encoding of the next bit plane. If bit was equal to zero, or a higher number if a lower resolution coding is desired, an output buffer containing outputs of all x1 and x2 encodings is written at 570 and the process ends at 575.

The adaptive Run-length+Golomb-Rice (ARLGR) coder is where the encoding gain resides. It maps long vectors x1 with lots of zeros in a more compact code, with fewer zeros. The ARLGR encoder can be used to encoding binary sequences with or without associated sign bits, as shown below. In order to understand the ARGLR encoder, first consider the basics of the run-length encoding and Golomb-Rice coding.

In its general form, the basic idea behind run-length (RL) coding is to replace long strings of the same value in an input data vector by a code that specifies the value to be repeated and how many times the values should be repeated. If such repetitive strings are long enough and frequent enough, RL coding leads to a significant reduction in the number of bits needed to represent the data vector.

RL coding can be applied to the encoding of binary data in which either 0 or 1 is significantly more likely to occur. One example is in graphics files, for example, a digitized black drawing on a white background. If white picture elements (pixels) are represented by a bit equal to 0 and black dots by a bit equal to 1, it's clear that zeros are much more likely to occur. In fact, many standard graphics file formats use RL coding.

In 1966 Golomb proposed a simple code for the representation of positive numbers. It was later shown that the Golomb code is indeed optimal (minimum expected length) if the numbers are drawn from a source with geometric probability distribution, i.e. if $\text{Prob}\{x=n\}=ab^n$, where a and b are parameters. A few years later Rice independently derived a subset of the Golomb code that is very easy to implement in practice. These codes became known as Golomb-Rice codes.

In the present invention the Golomb-Rice codes for a source of binary digits are combined with RL codes. The resulting Run-Length=Golomb-Rice code is shown in Table 2. The code is characterized by a parameter k, which controls the length of the run associated to the codeword 0; this maximum run length is equal to $2^k$.

TABLE 2

Run-Length + Golomb-Rice encoding of a source generating symbols $\epsilon \{0, 1\}$

| K | INPUT STRING | OUTPUT BINARY CODE | K | INPUT STRING | OUTPUT BINARY CODE |
|---|---|---|---|---|---|
| 0 | 0 | 0 | 3 | 00000000 | 0 |
|   | 1 | 1 |   | 1 | 10000 |
| 1 | 00 | 0 |   | 01 | 10010 |
|   | 1 | 10 |   | 001 | 10011 |
|   | 01 | 11 |   | 0001 | 10101 |
| 2 | 0000 | 0 |   | 00001 | 10111 |
|   | 1 | 100 |   | 000001 | 11000 |
|   | 01 | 101 |   | 0000001 | 11010 |
|   | 001 | 110 |   | 00000001 | 11100 |
|   | 0001 | 111 |   |   |   |

For encoding of the x1 vector in the bit-plane encoder described earlier, we need to append the sign to the codeword of each nonzero bit. For that, a simple extension of the RLGR code is used as shown in Table 3.

TABLE 3

Run-Length + Golomb-Rice encoding of a source generating symbols $\epsilon \{0, +1, -1\}$

| K | INPUT STRING | OUTPUT BINARY CODE | k | INPUT STRING | OUTPUT BINARY CODE |
|---|---|---|---|---|---|
| 0 | 0 | 0 | 3 | 00000000 | 0 |
|   | +1 | 10 |   | +1 | 10000 |
|   | -1 | 11 |   | -1 | 10001 |
| 1 | 00 | 0 |   | 0+1 | 10010 |
|   | +1 | 100 |   | 0-1 | 10011 |
|   | -1 | 101 |   | 00+1 | 10100 |
|   | 0+1 | 110 |   | 00-1 | 10101 |
|   | 0-1 | 111 |   | 000+1 | 10110 |
| 2 | 0000 | 0 |   | 000-1 | 10111 |
|   | +1 | 1000 |   | 0000+1 | 11000 |
|   | -1 | 1001 |   | 0000-1 | 11001 |
|   | 0+1 | 1010 |   | 00000+1 | 11010 |
|   | 0-1 | 1011 |   | 00000-1 | 11011 |
|   | 00+1 | 1100 |   | 000000+1 | 11100 |
|   | 00-1 | 1101 |   | 000000-1 | 11101 |
|   | 000+1 | 1110 |   | 0000000+1 | 11110 |
|   | 000-1 | 1111 |   | 0000000-1 | 11111 |

For a given source of input vectors, using either the $\{0,1\}$ or the $\{0,+1,-1\}$ alphabets, the parameter k should be chosen in order to minimize the expected code length. If the source has no memory, has constant statistics over time, and is characterized by $P_0=\text{Prob}\{\text{symbol}=0\}$, then it is easy to compute the optimal value of k as a function of $P_0$.

In practice, however, binary (or binary+sign) vectors are not stationary. Typical examples include data obtained from the physical world, such as quantized wavelet coefficients of pictures or scanned documents. Therefore, we need to adjust the RLGR parameter k over time, to best match the local statistics of the data. Many strategies have been considered, mostly involving dividing the input data in blocks of appropriate length. For each block, $P_0$ is estimated and then the optimal value of k is computed. An additional code is then sent at the beginning of each block to indicate the value of k that should be used by the decoder.

The encoder 240 takes a new approach. A backward-adaptive strategy is used for changing the RLGR parameter k. By backward-adaptive, it is meant that variations in k are computed based on encoded symbols, not directly on the input data. The basic strategy is that the value of k to be used in encoding the next symbol should depend only on previously encoded data. Therefore, all the decoder needs to do to recover the changing values of k is to apply the same adaptation rule as the encoder. Therefore, to simplify decoding it is important that such a rule be as simple as possible to compute.

The new adaptive Run-Length+Golomb-Rice (ARLGR) encoder 240 uses the following rules for changing the parameter k. Several parameters are first defined at block 604. A scale factor L is first defined and is used to define kp as L*k. kp is an auxiliary parameter whose value moves up or down by an amount Up or Dn respectively to permit fractional moves of k without the use of floating-point arithmetic. Finally, Uq is defined and used to move kp up if the output code was zero and k was equal to zero. An input buffer x is read at 606, and contains M numbers. At 608, k is set to k0, kp is set to L*k and run is set to 0. The process is started with a value of k that is a good choice for the long-term statistics of the incoming data, e.g. k=2. Starting with the first symbol, xindex=1 at 610, symbol is set to x(xindex) and runmax is set to $2^k$.

As an overview of the encoding process, after encoding a source symbol, kp is adjusted based on the emitted output code. If the output code was 0 and k≠0, kp is incremented by a predefined increment step Up, i.e. set kp=kp+Up. If the output code was 0 and k=0, kp is incremented by a predefined increment step Uq, i.e. set kp=kp+Uq.

If the output code started with a 1 (corresponding to a nonzero input), kp is decremented by a predefined decrement step Dn, i.e. set kp=kp−Dn. The value of k for encoding the next input symbol is set to k=⌊kp/L⌋(i.e. truncate kp/L down to the nearest integer.

The algorithm is based in a simple strategy. If a run of zeros is encountered, k is increased to allow for longer sequences of zeros to be captured by a single output bit=0. If a nonzero symbol is encountered, k is reduced to avoid excessively long output codes. The use of the auxiliary parameter kp and the scale factor L above allows adjustment of k in fractional steps without having to use floating-point arithmetic as indicated above.

For most of the data tested in the ARLGR encoder, the performance was quite good (encoded rates very close to source entropies), for the following. typical choice of parameters: L=4, Up=4, Dn=5, and Uq=2. In some cases, adjustments on these parameters can lead to slightly better performance.

Figure 6:
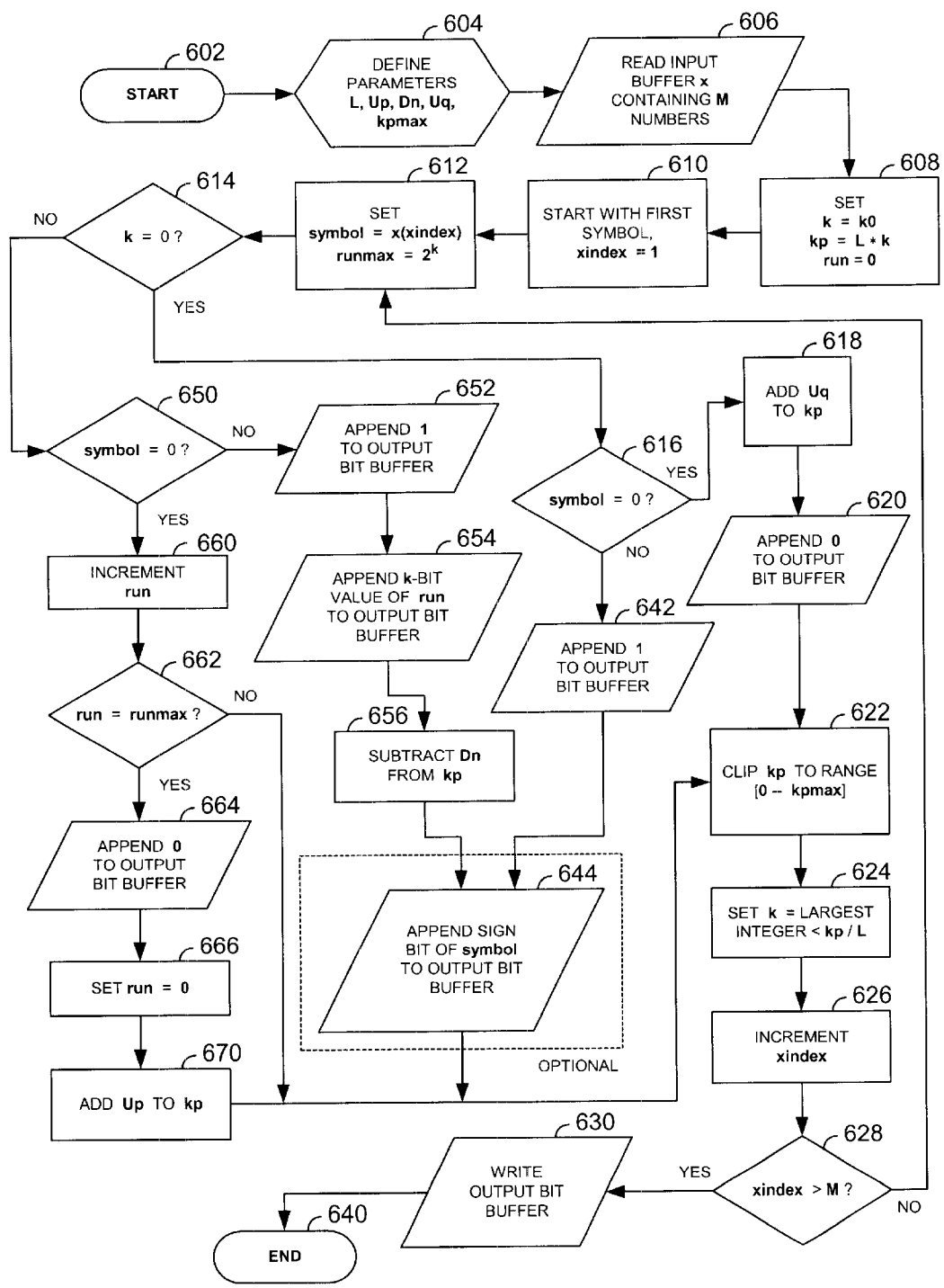
FIG. 6 is a flow chart showing further detail of the operation of the run-length adaptive encoder of FIG. 2.

Returning to the description of the flowchart in FIG. 6, following initialization and defining of parameters as described above with reference to blocks 602, 604, 606, 608, 610 and 612, k is first checked at 614 to see if it is equal to zero. If it is, and if symbol is zero, Uq is added to kp at 618. A zero is appended to the output buffer at 620 and if kp is out of range—above kpmax—at 622, it is clipped. At 624, k is set to the largest integer less than kp/L, the scale factor. Xindex is then incremented, and if less than M as determined at 628, the next symbol is selected at 612. If greater than M, the output bit buffer is written to at 630 and the process ends at 640.

Referring back to decision block 616, if symbol was not equal to zero, a 1 is appended to the output bit buffer at 642, and a sign bit of symbol is appended to the output bit buffer at 644 if the data has a sign bit, and processing continues at 622 to check to see if kp is within range.

If k is not equal to 1 at block 614, a further check of symbol is performed at 650. If the symbol is not equal to zero, a 1 is appended to the output bit buffer at 652 and a k-bit value of run is appended to the output bit buffer at 654. At 656, Dn is subtracted from kp, and processing continues at 644, where an optional sign bit is appended.

If symbol is found to be zero at 650, run is checked at 622 to see if it is equal to runmax. If not, kp is clipped to not exceed kpmax at 622. If run was equal to runmax at 662, a zero is appended to the output bit buffer at 664, and run is set to zero at 666. Finally, Up is added to kp, and processing again reverts to block 622 for clipping of kp, setting of k at 624, incrementing xindex at 626 and checking to see if the last symbol has been processed at 628. If so, the information is written to the ouput bit buffer at 630 and the process is ended at 640.

In Table 4 results of using the bit plane encoder on quantized wavelet coefficients are shown. Note that the simple bit-plane encoder performs better than the adaptive arithmetic encoders (which are considered the state-of-the-art), in spite of being computationally simpler.

TABLE 4

Output code length in bytes for quantized and reordered wavelet coefficients as input.

| Data Set (length = 30,000 values) | Bit-plane encoder of this invention | Adaptive arithmetic encoder | Adaptive ELS encoder |
|---|---|---|---|
| Wavelet data, low frequency, | 8,359 | 12,748 | 12,129 |
| Wavelet data, medium frequency | 4,906 | 5,608 | 5,022 |

A major advantage of the encoder, not shared by the arithmetic encoders, is scalability. With the described bit-plane encoding, a lower fidelity version of the signal can be easily obtained by stopping the decoding process at a bit plane higher than plane 1. That allows for progressive transmission and reconstruction of the information, and important feature for communication channels such as the Internet. Another application of scalability is in digital cameras, for example. If the user wants to take more pictures and is willing to sacrifice quality of pictures already stored, lower bit planes of existing images can be removed to release storage for new pictures.

Although the ARLGR encoder is described in conjunction with its use in a bit plane encoder, it can be quite useful as a general-purpose encoder for binary data in which the value 0 is much more probably than the value 1. This is especially true in cases where the probability distribution is constantly changing. For example, consider the problem of encoding a black-and-white drawing scanned at a resolution of 480×640 pixels. Assuming the mapping white=0 and black=1, the ARLGR encoder may be applied directly to the data. However, encoder 240 does not handle runs of 1s very well, and so a difference operator is first applied across all rows of pixels. Starting with the second row and moving down, each pixel value is replaced by 0 if it has the same color as the same pixel in the row above, or 1 if it has a different color. This is repeated across columns. The resulting bits are encoded with the ARLGR encoder 240.

This provides a mapping of runs of either white or black into runs of zeros, without any loss of information. That makes the data more suitable for ARLGR encoding. Table 5 shows a comparison of the performance of such a simple encoder with other approaches.

TABLE 5

Output code length in bytes for encoding typical black-and-white picture data.

| ARLGR encoder described | CCITT fax standard | Adaptive ELS encoder | Adaptive arithmetic encoder |
| --- | --- | --- | --- |
| 3,294 | 5,926 | 5,331 | 3,393 |

The ARLGR encoder 240 algorithm outperforms the standard fax encoding algorithm by almost a factor of two. It uses only 55% of the bytes used by the fax algorithm. In fact, the new ARLGR-based encoder even surpassed the state-of-the-art adaptive arithmetic encoder by a small margin for this particular image. In addition, it had the lowest computational complexity. It should be noted that this is just one example, and that the results may vary depending on the image used and tuning of parameters.

Figure 8:
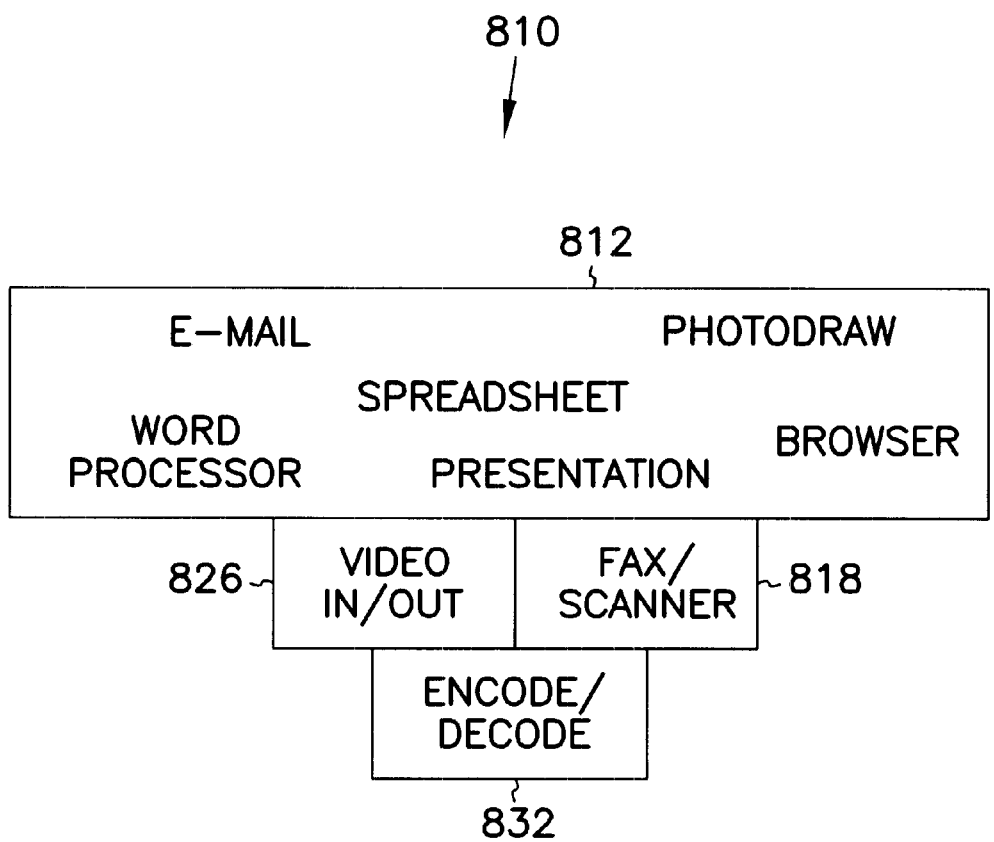
FIG. 8 is a block diagram showing the use of the encoder of FIG. 2 and the decoder of FIG. 3 in a software application suite which handles image data.

In FIG. 8, a block diagram of a suite of office programs is shown generally at 810. One particular office suite comprises a plurality of high level applications indicated at 812, including such applications as word processing, email, spreadsheet, presentation tools, photo manipulation programs, and browsers. Supporting these applications are at least two lower level software, hardware or a combination thereof functions at 826 and 818. The functions shown include a video in/out function 826 and a fax/scanner function 818. Many other functions may also reside at this level.

In particular, the video function provides the ability to both display video and receive video and image data from external sources. The video and fax/scanner functions make use of the encoder and decoder described herein and indicated at block 832 to provide encoding and decoding functions as previously described. If raw image or other suitable data is captured in pixel or other form, the encoder 832 is used to encode it. Further, if encoded data is obtained from any source employing the type of encoding described here, the decoder at 832 called by the application receiving it to transform or decode it to a displayable or useable format.

It should be noted that many of the applications which may comprise such an integrated office suite, such as Microsoft Office or follow-on products that may integrate even more applications are more and more likely to deal with data that needs to be compressed or decompressed. The present invention provides an alternative to other forms of coding which removes the blocking artifacts present in JPEG, and is less complex to implement in either software, hardware or hybrid forms as desired. The encoder/decoder at 832 is also easy to integrate into such an office suite.

Conclusion

Reordering of quantized wavelet coefficients is performed to cluster large and small wavelet coefficients into separate groups without requiring the use of data-dependent data structures. The coefficients are then adaptively encoded based on a run-length code which continuously modifies a parameter that controls the codewords used to represent strings of quantized coefficients, seeking to minimize the number of bits spent in the codewords. Since the ordering pattern is fixed, and the coefficient encoding does not require a modified table for each image, the invention lends itself to easier hardware or software implementations. Further advantages include the elimination of blocking artifacts, and single pass encoding for any desired compression ratio for imagedata.

A decoder is described which applies the above encoding and blocking in reverse order. Decoding of the encoded coefficients is first performed, followed by an unshuffling of the coefficients. The unshuffled coefficients are then subjected to an inverse wavelet transform to recover the transformed and compressed data, such as image pixels. Adaptive arithmetic coding may also be used in conjunction with the reordering to obtain similar compression benefits, but with slightly higher complexity.

By not requiring the use of data-dependent data structures such as zero trees, or a separate list for set partitions in trees, hardware implementations are easier to build. This application is intended to cover any adaptations or variations of the present invention. It is manifestly intended that this invention be limited only by the claims and equivalents thereof.

I claim:

1. A method of encoding finite alphabet data characters, the method comprising:
    initializing a string length for an adaptive run-length encoder;
    modifying the string length based on a modified encoding parameter produced by,
        applying a scaling factor to a current encoding parameter,
        adjusting the value of the scaled encoding parameter based on already encoded characters, and
        applying an inverse scaling factor to the adjusted and scaled encoding parameter to produce the modified encoding parameter.

2. The method of claim 1 wherein the encoding parameter is increased each time an expected character is encountered.

3. The method of claim 2 wherein the expected character is zero.

4. The method of claim 1 wherein the encoding parameter is decreased each time an expected character is not encountered.

5. The method of claim 4 wherein the expected character is zero.

6. The method of claim 1 wherein the characters are encoded on a bit plane basis.

7. The method of claim 6 wherein the least significant bit planes are encoded using binary encoding.

8. The method of claim 6 wherein only the most significant bit planes are encoded to modify the resolution of the encoding.

9. The method of claim 1 wherein a string of zeros is represented by a small value.

10. A computer readable medium having instructions stored thereon causing a computer to perform the method of claim 1.

11. The method of claim 1 wherein the action of initializing the string length for the adaptive run-length encoder, comprises an action of setting the initial string length to equal 2 to the power of an initial encoding parameter.

12. The method of claim 11, wherein the initial encoding parameter is equal to 2.

13. The method of claim 1 wherein the finite alphabet data characters are characterized using binary values, and wherein the action of adjusting the value of the scaled encoding parameter based on already encoded characters, comprises the actions of, for each binary value in sequence:
   determining if the value is a first or second binary value;
   whenever the value is the first binary value, taking no action unless the number of preceding pixels locations for which no action has been taken equals a current string length, and if it does, establishing a first type of codeword by representing the number of preceding values for which no action has been taken with a single first encoding value;
   whenever the value is the second binary value, establishing a second type of codeword by representing the value under consideration and the number of preceding values for which no action has been taken with a second encoding value and a binary word indicating the number of preceding values for which no action has been taken; and
   whenever a codeword is established, increasing the current encoding parameter by a first prescribed amount if the codeword is of the first type and decreasing the current encoding parameter by a second prescribed amount if the codeword is of the second type.

14. The method of claim 13 wherein the action of modifying the string length based on the modified encoding parameter, comprises an action of changing the current string length to equal 2 to the power of the modified encoding parameter.

15. The method of claim 13, wherein the action of applying the inverse scaling factor to the adjusted and scaled encoding parameter to produce the modified encoding parameter comprises dividing the adjusted and scaled encoding parameter kp by the scaling factor L and setting the modified encoding parameter k to the largest integer value less than kp/L.

16. An encoder for encoding finite alphabet data comprising:
   means for initializing a string length for an adaptive run-length encoder;
   means for modifying the string length based on a modified encoding parameter produced by,
      means for applying a scaling factor to a current encoding parameter,
      means for adjusting the value of the scaled encoding parameter based on already encoded characters, and
      means for applying an inverse scaling factor to the adjusted and scaled encoding parameter to produce the modified encoding parameter.

17. A method of decoding finite alphabet data characters which have been encoded using a backward adaptive run length encoding, the method comprising:
   initializing a string length for an adaptive run-length decoder;
   modifying the string length based on a modified decoding parameter produced by,
      applying a scaling factor to a current decoding parameter,
      adjusting the value of the scaled decoding parameter based on already decoded characters, and
      applying an inverse scaling factor to the adjusted and scaled decoding parameter to produce the modified decoding parameter.

18. The method of claim 17 wherein the decoding parameter is increased each time an expected character is encountered.

19. The method of claim 18 wherein the expected character is zero.

20. The method of claim 17 wherein the decoding parameter is decreased each time an expected character is not encountered.

21. The method of claim 20 wherein the expected character is zero.

22. The method of claim 17 wherein the characters are decoded on a bit plane basis.

23. The method of claim 22 wherein the least significant bit planes are decoded using binary encoding.

24. The method of claim 23 wherein only the most significant bit planes are decoded to modify the resolution of the encoding.

25. The method of claim 17 wherein a string of zeros is represented by a small value.

26. A computer readable medium having computer executable instructions stored thereon for causing a computer to perform a method of decoding finite alphabet data characters which have been encoded using a backward adaptive run length encoding, the method comprising:
   initializing a string length for an adaptive run-length decoder;
   modifying the string length based on a modified decoding parameter produced by,
      applying a scaling factor to a current decoding parameter,
      adjusting the value of the scaled decoding parameter based on already decoded characters, and
      applying an inverse scaling factor to the adjusted and scaled decoding parameter to produce the modified decoding parameter.

27. A decoder for decoding finite alphabet data comprising:
   means for initializing a string length for decoding adaptive run-length encoded data;
   means for modifying the string length based on a modified decoding parameter produced by,
      means for applying a scaling factor to a current decoding parameter,
      means for adjusting the value of the scaled decoding parameter based on already decoded data, and
      means for applying an inverse scaling factor to the adjusted and scaled decoding parameterto produce the modified decoding parameter.

28. A process for encoding finite alphabet data characters, which are characterized by a sequence of binary values, comprising using a computing device to perform the following process actions:
   for each binary value in sequence:
      determining if the value is a first or second binary value;
      whenever the value is the first binary value, taking no action unless the number of preceding pixels locations for which no action has been taken equals a current string length, and if it does, establishing a first type of codeword by representing the number of preceding values for which no action has been taken with a single first encoding value;
      whenever the value is the second binary value, establishing a second type of codeword by representing the value under consideration and the number of preceding values for which no action has been taken with a second encoding value and a binary word indicating the number of preceding values for which no action has been taken; and whenever a codeword is established, modifying the current string length to establish a new current string length based on a modified encoding parameter, said modified encoding parameter being produced by, applying a scaling factor to a current encoding parameter, adjusting the value of the scaled encoding parameter based on already encoded values, and applying an inverse scaling factor to the adjusted and scaled encoding parameter to produce the modified decoding parameter and.

29. The process of claim 28 wherein the action of modifying the string length based on the modified encoding parameter, comprises an action of changing the current string length to equal 2 to the power of the modified encoding parameter.

30. The process of claim 28 wherein the action of adjusting the value of the scaled encoding parameter based on already encoded values, comprises an action of increasing the current encoding parameter by a first prescribed amount if the last-generated codeword is of the first type and decreasing the current encoding parameter by a second prescribed amount if the last-generated codeword is of the second type.

31. The process of claim 30, wherein the action of applying the scaling factor to the current encoding parameter comprises multiplying the scaling factor L by the current encoding parameter k to produce the scaled encoding parameter kp.

32. The method of claim 31 wherein the action of increasing the current encoding parameter by a first prescribed amount if the codeword is of the first type, comprises the actions of:

determining whether k is equal to zero;

whenever k is equal to zero, increasing kp by a first prescribed increment Uq; and whenever k is not equal to zero, increasing kp by a second prescribed increment Up.

33. The method of claim 32 wherein the scaling factor L is 4, the first prescribed increment Uq is 2, and the second prescribed increment Up is 4.

34. The method of claim 31 wherein the action of decreasing the current encoding parameter by a second prescribed amount if the codeword is of the second type, comprises an action of decreasing kp by a prescribed increment Dn.

35. The method of claim 34 wherein the scaling factor L is 4, and the prescribed increment Dn is 5.

36. The method of claim 28 wherein the action of applying the inverse scaling factor to the adjusted and scaled encoding parameter to produce the modified encoding parameter comprises dividing the adjusted and scaled encoding parameter kp by the scaling factor L and setting the modified encoding parameter k to the largest integer value less than kp/L.

37. A process for decoding finite alphabet data characters, which are characterized by a sequence of binary values, and which are encoded by a process that reduces the sequence of binary values to a series of codewords from which can be derived whether each value in the sequence exhibits the first binary value or the second binary value, said codewords coming in two types a first of which is a first codeword value representing a number of binary values in a string of values that have the first binary value and the second of which comprises a second codeword value followed by a binary word that indicates the number of binary values preceding a value having the second binary value that exhibit the first binary value, said process comprising using a computing device to perform the following process actions:

(a) receiving the series of codewords;

(b) establishing a current string length that is identical to the initial length used in encoding the sequence of binary values, wherein the string length represents a number of consecutive binary values having the first binary value;

(c) determining if the last-received codeword is of the first or second type;

(d) whenever the last-received codeword is of the second type, generating a number of values exhibiting the first binary value as indicated by the binary word component of the codeword and then generating an additional value exhibiting the second binary value; and (e) whenever the last-received codeword is of the first type, generating a number of values exhibiting the first binary value equal to the current string length;

(f) modifying the current string length to establish a new current string length based on a modified decoding parameter, said modified decoding parameter being produced by, applying a scaling factor to a current decoding parameter, which is initially the same as that used as the initial encoding parameter during encoding, adjusting the value of the scaled decoding parameter based on already decoded values, and applying an inverse scaling factor to the adjusted and scaled decoding parameter to produce the modified decoding parameter; and (g) repeating actions (c) through (f) using the new current string length.

38. The process of claim 37, wherein the action of modifying the string length based on the modified decoding parameter, comprises an action of changing the current string length to equal 2 to the power of the modified decoding parameter.

39. The process of claim 37, wherein the action of adjusting the value of the scaled decoding parameter based on already decoded values, comprises the actions of:

increasing the current decoding parameter by a first prescribed amount if the last-received codeword is of the first type; and decreasing the current decoding parameter by a second prescribed amount if the last received codeword is of the second type.

* * * * *

UNITED STATES PATENT AND TRADEMARK OFFICE
CERTIFICATE OF CORRECTION

PATENT NO.   : 6,477,280 B1                                             Page 1 of 1
DATED        : November 5, 2002
INVENTOR(S)  : Malvar It is certified that error appears in the above-identified patent and that said Letters Patent is hereby corrected as shown below:

Column 1,
Line 46, "the. faster" should be changed to -- the faster --

Column 8,
Line 21, equation should appear as follows: -- $q(r,s) = \text{sgn}(X(r,s))\lfloor |X(r,s)|/T \rfloor$ --

Column 10,
Line 4, "his" should be changed to -- This --
Line 9, "$N_BLK$" should be changed to -- NBLK --

Signed and Sealed this

Twenty-ninth Day of July, 2003

JAMES E. ROGAN
*Director of the United States Patent and Trademark Office*